(12) United States Patent
Luo et al.

(10) Patent No.: US 7,816,760 B2
(45) Date of Patent: Oct. 19, 2010

(54) SEMICONDUCTOR STRUCTURE INCLUDING LAMINATED ISOLATION REGION

(75) Inventors: Zhijiong Luo, Carmel, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 12/110,633

(22) Filed: Jun. 20, 2008

(65) Prior Publication Data
US 2008/0246112 A1    Oct. 9, 2008

Related U.S. Application Data

(62) Division of application No. 11/685,457, filed on Mar. 13, 2007, now Pat. No. 7,393,751.

(51) Int. Cl.
  *H01L 21/00* (2006.01)
(52) U.S. Cl. ............ 257/510; 257/384; 257/330
(58) Field of Classification Search ............ 257/510, 257/384, 330
  See application file for complete search history.

(56) References Cited

U.S. PATENT DOCUMENTS

| 6,133,105 | A * | 10/2000 | Chen et al. ............... 438/296 |
| 6,133,155 | A | 10/2000 | Tsai-Sen et al. |
| 6,277,709 | B1 | 8/2001 | Wang et al. |
| 6,465,325 | B2 | 10/2002 | Ridley et al. |
| 6,566,228 | B1 * | 5/2003 | Beintner et al. ........... 438/430 |
| 6,737,334 | B2 * | 5/2004 | Ho et al. ................... 438/424 |
| 6,878,606 | B2 * | 4/2005 | Ohnishi et al. ............ 438/424 |
| 7,033,909 | B2 | 4/2006 | Kim et al. |
| 7,135,371 | B2 | 11/2006 | Han et al. |
| 7,193,271 | B2 | 3/2007 | Lee et al. |
| 7,393,751 | B1 * | 7/2008 | Luo et al. ................. 438/296 |
| 2003/0013272 | A1 | 1/2003 | Hong et al. |
| 2003/0234433 | A1 * | 12/2003 | Tran ......................... 257/506 |
| 2004/0072408 | A1 * | 4/2004 | Yun et al. .................. 438/435 |
| 2005/0009293 | A1 | 1/2005 | Kim et al. |
| 2005/0266647 | A1 | 12/2005 | Kim et al. |
| 2006/0131665 | A1 * | 6/2006 | Murthy et al. ............. 257/384 |
| 2006/0148196 | A1 | 7/2006 | Thean et al. |
| 2007/0020879 | A1 * | 1/2007 | Baek et al. ................ 438/424 |
| 2008/0246112 | A1 * | 10/2008 | Luo et al. .................. 257/510 |

OTHER PUBLICATIONS

Quirk, et al., "Silicon and Wafer Preparation", Semiconductor Manufacturing Technology, Prentice Hall, 2001 (pp. 87-88).

* cited by examiner

*Primary Examiner*—Laura M Menz
(74) *Attorney, Agent, or Firm*—Scully, Scott, Murphy & Presser, P.C.; H. Daniel Schnurmann

(57) ABSTRACT

A semiconductor structure and a related method for fabrication thereof include an isolation region located within an isolation trench within a semiconductor substrate. The isolation region comprises; (1) a lower lying dielectric plug layer recessed within the isolation trench; (2) a U shaped dielectric liner layer located upon the lower lying dielectric plug layer and partially filling the recess; and (3) an upper lying dielectric plug layer located upon the U shaped dielectric liner layer and completely filling the recess. The isolation region provides for sidewall coverage of the isolation trench, thus eliminating some types of leakage paths.

15 Claims, 3 Drawing Sheets

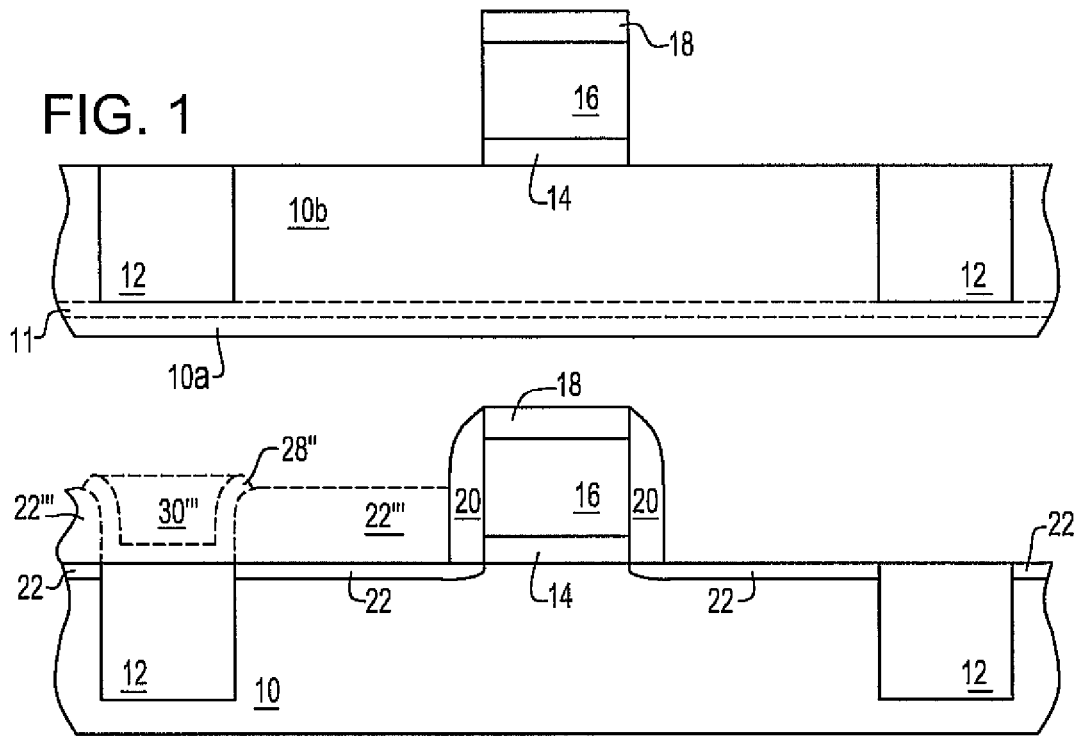
FIG. 1
FIG. 2
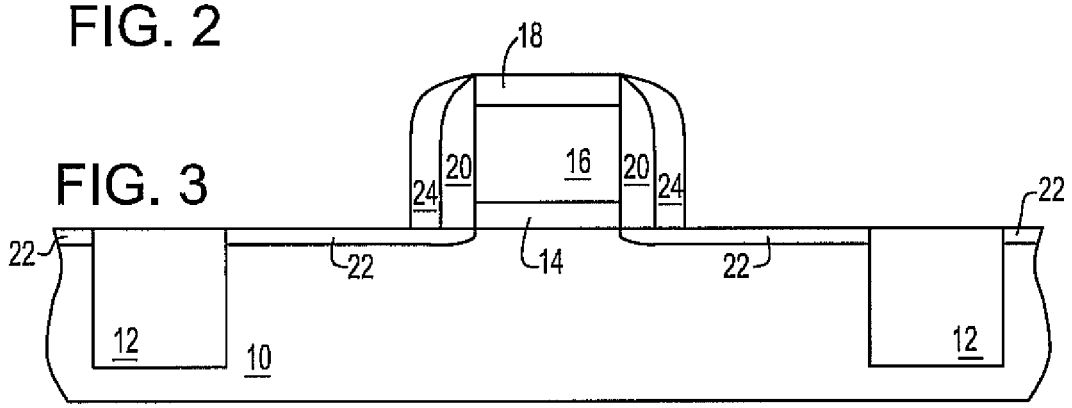
FIG. 3
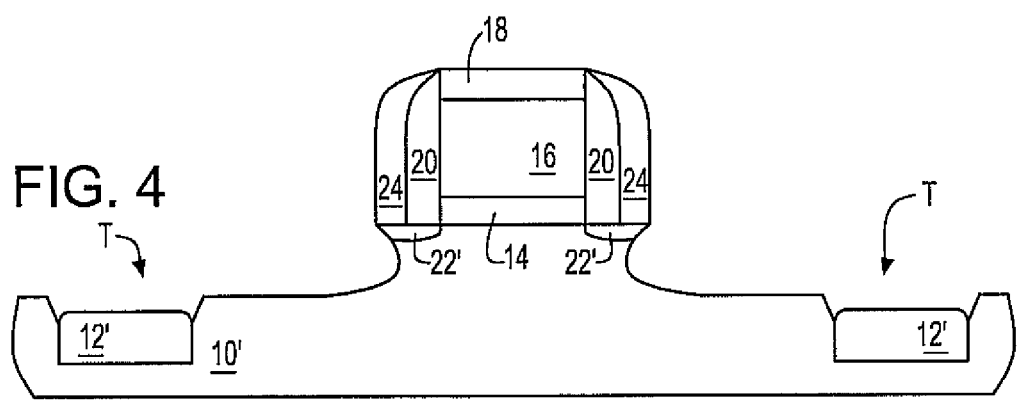
FIG. 4

SEMICONDUCTOR STRUCTURE INCLUDING LAMINATED ISOLATION REGION

CROSS-REFERENCE TO RELATED APPLICATIONS

This application is a divisional application of U.S. Ser. No. 11/685,457, filed Mar. 13, 2007, now U.S. Pat. No. 7,393,751.

BACKGROUND

1. Field of the Invention

The invention relates generally to semiconductor structures. More particularly, the invention relates to isolation regions within semiconductor structures.

2. Description of the Related Art

Common in the semiconductor fabrication art is the use of isolation regions for purposes of separating active regions within semiconductor substrates. In turn, semiconductor devices are often fabricated within the active regions that are separated by the isolation regions within the semiconductor substrates.

While isolation regions are thus quite common within the semiconductor fabrication art, isolation regions are nonetheless not entirely without problems. In particular, both a dimensional integrity and an electrical integrity of an isolation region are often difficult to effectively control when fabricating a semiconductor structure, since fabrication of a semiconductor structure often exposes an isolation region to a plurality of processing chemicals and reactive environments that may etch or otherwise degrade the isolation region.

Semiconductor structure and device dimensions are certain to continue to decrease as semiconductor technology advances. As a result thereof, desirable are isolation regions that provide semiconductor structures with enhanced performance, as well as methods for fabricating such isolation regions.

SUMMARY OF THE INVENTION

The invention comprises a semiconductor structure that includes an isolation region that is typically located at least in-part within an isolation trench, as well as a method for fabricating the semiconductor structure. The isolation region within the semiconductor structure includes: (1) a lower lying dielectric plug layer; (2) a U shaped dielectric liner layer located upon the lower lying dielectric plug layer; and (3) an upper lying dielectric plug layer located upon the U shaped dielectric liner layer. The isolation region finds particular use in semiconductor structures where a single component isolation region becomes recessed with respect to a semiconductor substrate within which is located the single component isolation region. Under such circumstances, the dielectric isolation capabilities of the single component isolation region may become compromised.

A semiconductor structure in accordance with the invention includes a semiconductor substrate including an isolation region located within the semiconductor substrate. In particular, the isolation region includes: (1) a lower lying dielectric plug layer; (2) a U shaped dielectric liner layer located upon the lower lying dielectric plug layer; and (3) an upper lying dielectric plug layer filling an aperture within the U shaped dielectric liner layer.

A particular method in accordance with the invention includes forming a lower lying dielectric plug layer within an isolation trench within a semiconductor substrate. The lower lying dielectric plug layer is recessed beneath a surface of the semiconductor substrate. The particular method also includes forming a U shaped dielectric liner layer upon the lower lying dielectric plug layer. The particular method also includes forming an upper lying dielectric plug layer filling an aperture within the U shaped dielectric liner layer.

Another particular method in accordance with the invention includes etching, while using at least a gate electrode as a mask, a semiconductor substrate including an isolation region to provide an etched semiconductor substrate and an etched isolation region that define a trench. The particular method also includes forming a semiconductor material layer upon the etched semiconductor substrate to provide an aperture that leaves the etched isolation region recessed beneath the semiconductor material layer. The particular method also includes forming a U shaped dielectric liner layer upon the etched isolation region and partially filling the aperture. The particular method also includes forming an upper lying dielectric plug layer upon the U shaped liner layer and filling the aperture.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein:

FIG. 1 to FIG. 10 show a series of schematic cross-sectional diagrams illustrating the results of progressive stages in fabricating a semiconductor structure in accordance with an embodiment of the invention. This particular embodiment of the invention comprises a preferred embodiment of the invention.

DESCRIPTION OF THE PREFERRED EMBODIMENTS

Figure 5:
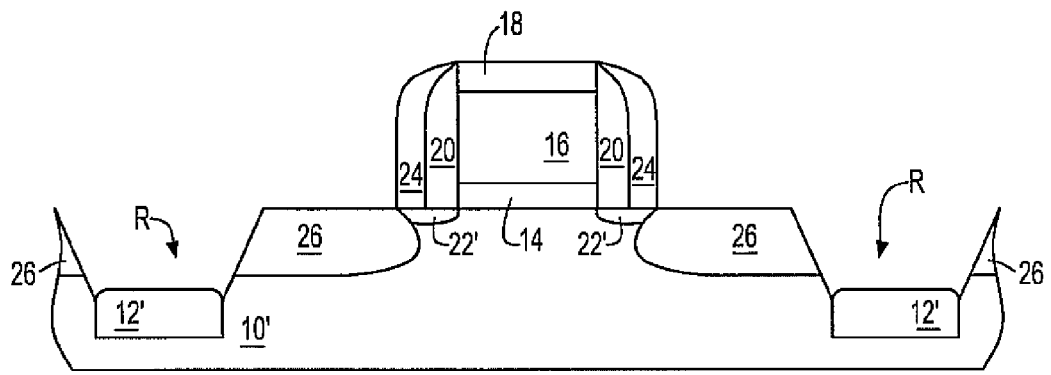

The invention, which includes a semiconductor structure including a laminated isolation region, as well as a method for fabricating the semiconductor structure including the laminated isolation region, is understood within the context of the description provided below. The description provided below is understood within the context of the drawings described above. Since the drawings are intended for illustrative purposes, the drawings are not necessarily drawn to scale.

FIG. 1 to FIG. 10 show a series of schematic cross-sectional diagrams illustrating the results of progressive stages in fabricating a semiconductor structure in accordance with an embodiment of the invention. This particular embodiment comprises a preferred embodiment of the invention. FIG. 1 shows a schematic cross-sectional diagram of the semiconductor structure at an early stage in fabrication thereof in accordance the embodiment.

FIG. 1 shows a base semiconductor substrate 10a. A buried dielectric layer 11 is located upon the base semiconductor substrate 10a, and a surface semiconductor layer 10b is located upon the buried dielectric layer 11. Portions of the surface semiconductor layer 10b are bounded by a plurality of isolation regions 12. In an aggregate, the base semiconductor substrate 10a, the buried dielectric layer 11 and the surface semiconductor layer 10b comprise a semiconductor-on-insulator substrate.

The base semiconductor substrate 10a may comprise any of several semiconductor materials. Non-limiting examples include silicon, germanium, silicon-germanium alloy, silicon carbide, silicon-germanium carbide alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10a has a thickness from about 0.001 to about 100 millimeters.

The buried dielectric layer 11 may comprise any of several dielectric materials. Non-limiting examples include oxides, nitrides and oxynitrides, particularly of silicon, but oxides, nitrides and oxynitrides of other elements are not excluded. The buried dielectric layer 11 may comprise a crystalline or a non-crystalline dielectric material, with crystalline dielectric materials being highly preferred. The buried dielectric layer 11 may be formed using any of several methods. Non-limiting examples include ion implantation methods, thermal or plasma oxidation or nitridation methods, chemical vapor deposition methods and physical vapor deposition methods. Typically, the buried dielectric layer 11 comprises an oxide of the semiconductor material from which is comprised the base semiconductor substrate 10a. Typically, the buried dielectric layer 11 has a thickness from about 50 to about 1e4 angstroms The surface semiconductor layer 10b may comprise any of the several semiconductor materials from which the base semiconductor substrate 10a may be comprised. The surface semiconductor layer 10b and the base semiconductor substrate 10a may comprise either identical or different semiconductor materials with respect to chemical composition, dopant polarity, dopant concentration and crystallographic orientation. Typically, the surface semiconductor layer 10b may have a thickness from about 50 to about 1 e5 angstroms.

The isolation regions 12 may comprise any of several isolation materials that will typically comprise dielectric isolation materials. Typically, the isolation regions 12 comprise a dielectric isolation material selected from the same group of dielectric isolation materials that may be used for the buried dielectric layer 11. However, a method used for fabricating the isolation regions 12 may be different from a method used for fabricating the buried dielectric layer 11. Typically, the isolation regions 12 comprise a silicon oxide or a silicon nitride dielectric material, or a composite or laminate thereof. More particularly intended within the embodiment is that the isolation regions 12 typically comprise a single dielectric material, and in particular a single silicon oxide dielectric material. The isolation regions 12 may generally comprise a single dielectric layer structure, or alternatively a dual dielectric layer or multiple dielectric layer structure with at least one dielectric layer serving as a liner layer directly in contact with surface semiconductor layer 10b that is illustrated in FIG. 1 (or a semiconductor substrate 10 that is illustrated in subsequent drawing figures). As is illustrated in FIG. 1, the isolation regions 12 are located within isolation trenches within the surface semiconductor layer 10b. The isolation trenches are typically, but not necessarily always, bounded at their bottoms by the buried dielectric layer 11.

The semiconductor-on-insulator substrate portion of the semiconductor structure that is illustrated in FIG. 1 may be fabricated using any of several methods. Non-limiting examples include lamination methods, layer transfer methods and separation by implantation of oxygen (SIMOX) methods.

Although FIG. 1 illustrates an embodiment of the invention within the context of a semiconductor on-insulator substrate comprising the base semiconductor substrate 10a, the buried dielectric layer 11 and the surface semiconductor layer 10b, neither the instant embodiment nor the invention is so limited. Rather, the instant embodiment and alternative embodiments may also be practiced under certain circumstances using a bulk semiconductor substrate (that would otherwise result from absence of the buried dielectric layer 11 under circumstances where the base semiconductor substrate 10a and the surface semiconductor layer 10b have identical chemical composition and crystallographic orientation). For simplicity, subsequent cross-sectional diagrams within the instant embodiment are illustrated absent the buried dielectric layer 11, and with a single semiconductor substrate 10 (or a derivative thereof) rather than a base semiconductor substrate 10a and a surface semiconductor layer 10b.

Alternatively, the embodiment also contemplates use of a hybrid orientation (HOT) substrate. A hybrid orientation substrate has multiple crystallographic orientations within a single semiconductor substrate.

FIG. 1 also shows (in cross-section): (1) a gate dielectric 14 located upon the surface semiconductor layer 10a; (2) a gate electrode 16 located upon the gate dielectric 14; and (3) a capping layer 18 located upon the gate electrode 16.

Each of the foregoing layers 14, 16 and 18 may comprise materials and have dimensions that are conventional in the semiconductor fabrication art. Each of the foregoing layers 14, 16 and 18 may also be formed using methods that are conventional in the semiconductor fabrication art.

The gate dielectric 14 may comprise conventional dielectric materials such as oxides, nitrides and oxynitrides of silicon that have a dielectric constant from about 4 (i.e., typically a silicon oxide) to about 8 (i.e., typically a silicon nitride), measured in vacuum. Alternatively, the gate dielectric 14 may comprise generally higher dielectric constant dielectric materials having a dielectric constant from about 8 to at least about 100. Such higher dielectric constant dielectric materials may include, but are not limited to hafnium oxides, hafnium silicates, zirconium oxides, lanthanum oxides, titanium oxides, barium-strontium-titantates (BSTs) and lead-zirconate-titanates (PZTs). The gate dielectric 14 may be formed using any of several methods that are appropriate to its material of composition. Non-limiting examples include thermal or plasma oxidation or nitridation methods, chemical vapor deposition methods (including atomic layer deposition methods) and physical vapor deposition methods. Typically, the gate dielectric 14 comprises a thermal silicon oxide dielectric material that has a thickness from about 5 to about 500 angstroms.

The gate electrode 16 may comprise materials including but not limited to certain metals, metal alloys, metal nitrides and metal silicides, as well as laminates thereof and composites thereof. The gate electrode 16 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrode 16 comprises a doped polysilicon material that has a thickness from about 50 to about 5000 angstroms.

The capping layer 18 comprises a capping material that in turn typically comprises a hard mask material. Dielectric hard mask materials are most common but by no means limit the instant embodiment or the invention. Non-limiting examples of hard mask materials include oxides, nitrides and oxynitrides of silicon. Oxides, nitrides and oxynitrides of other elements are not excluded. The capping material may be formed using any of several methods that are conventional in the semiconductor fabrication art. Non-limiting examples include chemical vapor deposition methods and physical vapor deposition methods. Typically, the capping layer 18 comprises a silicon nitride capping material that has a thickness from about 50 to about 5000 angstroms.

FIG. 2 shows a plurality of first spacers 20 located adjacent and adjoining opposite sidewalls (i.e., a plurality of spacer layers in cross-sectional view but a single spacer layer in plan view) of the gate dielectric 14, gate electrode 16 and capping layer 18. FIG. 2 also shows a plurality of extension regions 22 located within the semiconductor substrate 10 and separated by the gate electrode 16, beneath which is a channel region that also separates the extension regions 22. FIG. 2 finally shows in phantom some additional structures that are discussed in further detail below.

Within the instant embodiment, either the first spacers 20 or the extension regions 22 may be formed first.

The first spacers 20 typically comprise a dielectric spacer material. Similarly with other dielectric structures within the instant embodiment, candidate dielectric spacer materials again include oxides, nitrides and oxynitrides of silicon. Also again, oxides, nitrides and oxynitrides of other elements are not excluded. The first spacers 20 are formed using a blanket layer deposition and anisotropic etchback method that uses an anisotropic etching plasma for etching purposes. Typically, the first spacers 20 comprise a different dielectric material than the capping layer 18. Typically, the first spacers 20 comprise a silicon oxide material when the capping layer 18 comprises a silicon nitride material.

The extension regions 22 comprise an n dopant or a p dopant appropriate to a polarity or conductivity type of a field effect transistor desired to be fabricated incident to further processing of the semiconductor structure of FIG. 2. Non-limiting examples of n dopants include arsenic dopants, phosphorus dopants, halides thereof and hydrides thereof. Non-limiting examples of p dopants include boron dopants, halides thereof and hydrides thereof. Any of the foregoing dopants may be used for forming the extension regions 22 and other doped regions described below within the instant embodiment. Less conventional alternative dopants are not excluded. As is noted above, the extension regions 22 may be formed either before or after forming the first spacers 20. Thus, the extension regions 22 are formed using an ion implant method that uses at least the gate electrode 16 as a mask. Typically, the extension regions 22 are formed to a depth from about 10 to about 1000 angstroms within the semiconductor substrate 10 and with a concentration from about 1e16 to about 1e23 dopant atoms per cubic centimeter within the semiconductor substrate 10.

FIG. 3 shows a plurality of second spacers 24 located upon the plurality of first spacers 20. The second spacers 24 are formed using an analogous blanket layer deposition and anisotropic etchback method that is used for forming the first spacers 20. However, the second spacers 24 are formed of a different spacer material than the first spacers 20 and the isolation regions 12. Typically, when both the first spacers 20 and the isolation regions 12 comprise a silicon oxide material, the capping layer 18 and the second spacers 24 comprise a silicon nitride material.

FIG. 4 shows the results of etching the semiconductor substrate 10 while using the gate electrode 16, the first spacers 20 and the second spacers 24 as a mask. The resulting semiconductor structure includes an etched semiconductor substrate 10' that includes a trench T adjoining a pedestal shaped channel region beneath the gate electrode 16. The resulting semiconductor structure also includes a plurality of extension regions 22' that derive from the extension regions 22. Incident to the foregoing etching and subsequent wet chemical etch processing, a plurality of isolation regions 12' is formed from the isolation regions 12. The isolation regions 12' may be approximately planar with the lower plateau levels of the semiconductor substrate 10' that is illustrated in FIG. 4. Typically, each of the isolation regions 12' has a thickness from about 50 to about 5e4 angstroms.

The semiconductor substrate 10 that is illustrated in FIG. 3 may be etched to provide the semiconductor substrate 10' that is illustrated in FIG. 4 while using etch methods and materials that are otherwise generally conventional in the semiconductor fabrication art. Such etch methods may include anisotropic etch methods, isotropic etch methods and etch methods that include both isotropic etch characteristics and anisotropic etch characteristics. Non-limiting examples of such isotropic etch methods include wet chemical etch methods and certain dry plasma etch methods that may be undertaken at elevated reactor chamber pressures. Isotropic wet chemical etch methods will often use mixtures of aqueous acids such as nitric, hydrofluoric and acetic acids. Isotropic dry plasma etch methods will typically employ etchant gas compositions that include chlorine and/or fluorine containing etchant gases. Anisotropic dry plasma etch methods will typically employ etchant gas compositions analogous or equivalent to the etchant gas compositions that are used within isotropic dry plasma etch methods.

FIG. 5 shows a plurality of semiconductor material layers 26 located to backfill regions of the semiconductor substrate 10 that were etched away when forming the semiconductor substrate 10'. Also illustrated is a plurality of recesses R (i.e., apertures) that leave exposed the etched isolation regions 12'. The semiconductor material layers 26 are typically formed using an epitaxial method so as to replicate a crystallographic orientation of the semiconductor substrate 10'. The semiconductor material layers 26 also typically comprise a different semiconductor material than the semiconductor substrate 10', so that a desirable stress (i.e., a carrier mobility enhancing stress) is introduced into the pedestal shaped channel region beneath the gate electrode 16. Although by no means limiting the embodiment or the invention, the semiconductor material layers 26 typically comprise a silicon-germanium alloy semiconductor material when the semiconductor substrate 10' comprises: (1) a silicon semiconductor material for use when fabricating a P-type MOSFET; or (2) a silicon-carbon alloy semiconductor material for use when fabricating an N-type MOSFET.

An epitaxial method that may be used for forming the semiconductor material layers 26 may use source materials and deposition conditions that are otherwise generally conventional in the semiconductor fabrication art.

Figure 6:
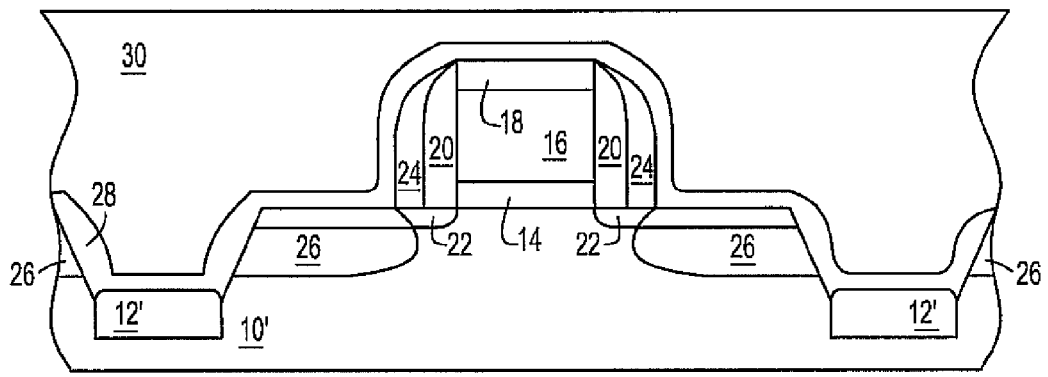

FIG. 6 first shows the results of reimplanting the extension regions 22' to again reform the extension regions 22 that are originally illustrated in FIG. 2. Optionally, a plurality of source and drain regions (hereinafter "source/drain regions") may also be formed at this time within the processing sequence of the instant embodiment, although the plurality of source/drain regions is alternatively shown at a later point in time of processing of the instant embodiment. Alternatively, the reimplanting of the extension regions 22' and/or the implanting of source/drain regions may be done at a later point in processing in accordance with the instant embodiment. Under certain circumstances where the semiconductor material layers 26 are in-situ doped, reimplanting of the extension region 22' and/or implanting of the source/drain regions may be omitted. As is illustrated within the context of FIG. 6, and also within subsequent cross-sectional diagrams, the extension regions 22 are in particular reimplanted to provide continuity through the semiconductor material layers 26.

The reimplanting of the extension regions 22' to form the extension regions 22, and any optional implanting to form source/drain regions, is preferably effected using an ion implantation method that uses a dopant ion and ion implantation conditions that are analogous, equivalent or identical to the dopant ion and ion implantation conditions that are used for forming the extension regions 22 that are originally illustrated within FIG. 2.

FIG. 6 also shows a liner layer 28 located upon the semiconductor structure of FIG. 5 after reimplanting the extension regions 22. FIG. 6 further also shows an inter-level dielectric (ILD) layer 30 located upon the liner layer 28. The liner layer 28 may comprise any of several liner materials and in particular dielectric liner materials. The inter-level dielectric (ILD) layer 30 may also comprise any of several inter-level dielectric (ILD) materials.

Typically, the liner layer 28 comprises a silicon nitride material while the inter-level dielectric (ILD) 30 layer comprises a silicon oxide material. Other material compositions for the liner layer 28 and the inter-level dielectric (ILD) layer 30 are also within the context of the embodiment. Generally, the liner layer 28 is intended to serve as an etch stop layer with respect to etching of the inter-level dielectric (ILD) layer 30. For reasons that will become more apparent within the context of further discussion below, the capping layer 18, the second spacer layers 24 and the liner layer 28 each are preferably comprised of a silicon nitride material.

The liner layer 28 and the inter-level dielectric (ILD) layer 30 may be formed using methods that are generally conventional in the semiconductor fabrication art. Particular methods include chemical vapor deposition methods, physical vapor deposition methods and spin-on methods. Typically the liner layer 28 has a thickness from about 10 to about 1000 angstroms and the inter-level dielectric (ILD) layer 30 has a thickness from about 10 to about 1e6 angstroms.

Figure 7:
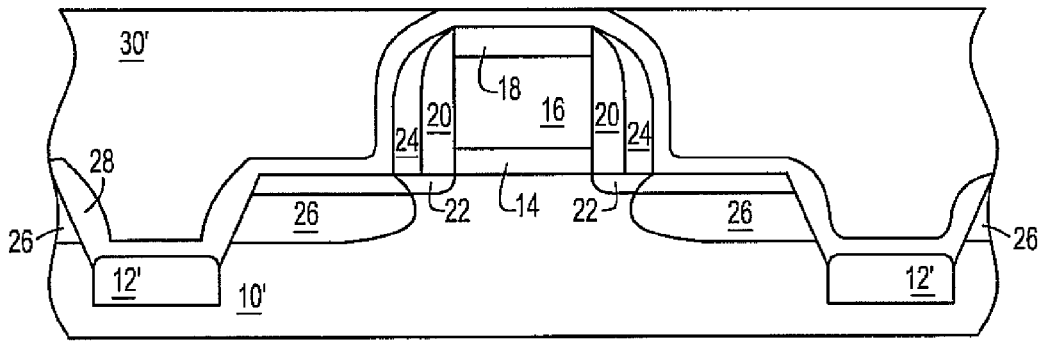

FIG. 7 shows an inter-level dielectric (ILD) layer 30' that results from planarizing of the inter-level dielectric layer 30. The foregoing planarization is effected while using the liner layer 28 as a planarizing stop layer. The foregoing planarization may be effected using any of several planarizing methods that are conventional in the semiconductor fabrication art. Non-limiting examples include mechanical planarizing methods, as well as chemical mechanical polish planarizing methods. Chemical mechanical polish planarizing methods are particularly common.

Figure 8:
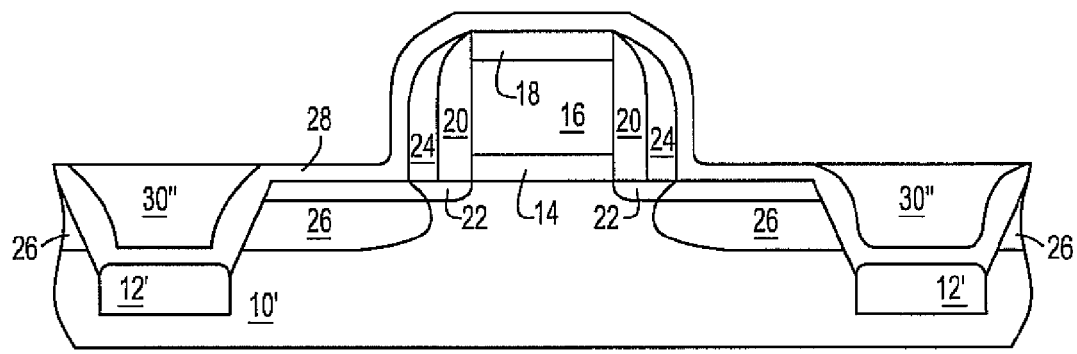

FIG. 8 shows a plurality of inter-level dielectric (ILD) layer residues 30" that result from further etching of the inter-level dielectric (ILD) layer 30'. The further etching may use an isotropic etchant or an anisotropic etchant, while in particular using the liner layer 28 as an etch stop layer. When the inter-level dielectric (ILD) layer 30' comprises a silicon oxide material and the liner layer 28 comprises a silicon nitride material, the inter-level dielectric (ILD) layer 30' may be etched to form the inter-level dielectric layer residues 30" while using a selective plasma etch method that in turn uses an etchant gas composition with appropriate etch specificity. Alternatively, a wet chemical etch method that uses a hydrofluoric acid containing material may also be used. Each of the plurality of inter-level dielectric (ILD) layer residues 30" typically has a thickness from about 50 to about 5e4 angstroms.

Figure 9:
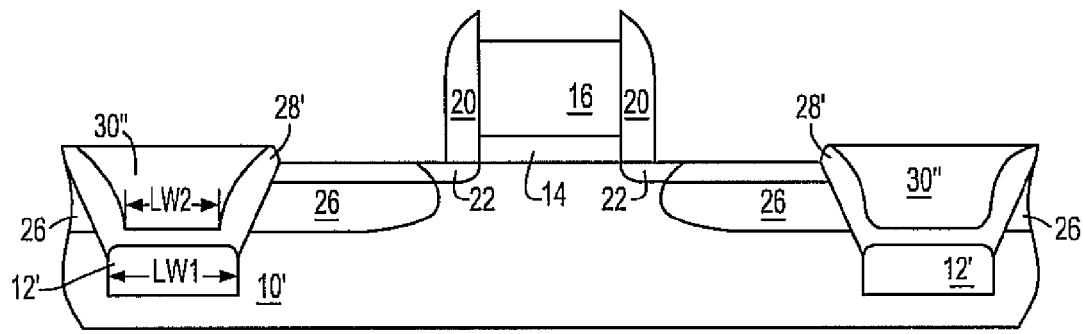

FIG. 9 shows the results of stripping: (1) exposed portions of the liner layer 28 to form a plurality of liner layers 28'; (2) the second spacers 24 (or optionally at least a portion of the second spacers 24); and (3) the capping layer 18, to leave exposed: (1) the gate electrode 16; as well as (2) portions of the semiconductor substrate 10' and portions of the semiconductor material layers 26 exposed between the gate electrode 16 and the liner layers 28'. The foregoing stripping may be effected using methods and materials that are otherwise generally conventional in the semiconductor fabrication art. Non-limiting examples include in particular wet chemical stripping methods that use an aqueous phosphoric acid solution at elevated temperatures. Other stripping methods are not excluded.

As is illustrated within the schematic cross-sectional diagram of FIG. 9, an active region of the semiconductor substrate 10' (including the semiconductor material layers 26) is bounded by a plurality of isolation regions. In particular, each isolation region comprises: (1) an etched isolation region 12' (i.e., a lower lying dielectric plug layer) having a thickness from about 50 to about 5e4 angstroms; (2) a U shaped dielectric liner layer 28' located upon the etched isolation region 12' and having a thickness from about 10 to about 1e3 angstroms; and (3) an inter-level dielectric layer residue 30" (i.e., an upper lying dielectric plug layer) located upon the U shaped dielectric liner layer 28' and having a thickness from about 50 to about 5e4 angstroms. As is illustrated in FIG. 9, each of the etched isolation regions 12' has a maximum linewidth LW1 greater than a minimum linewidth LW2 of each of the inter-level dielectric layer residues 30' located thereover. Within the context of the instant embodiment, the maximum linewidth LW1 of each of the etched isolation regions 12' equals the minimum linewidth LW2 of each of the inter-level dielectric layer residues 30" plus two times a thickness of each of the U shaped dielectric liner layers 28'. As is also illustrated in FIG. 9, the U shaped dielectric liner layers 28' are completely above the etched isolation regions 12' and completely bound the inter-level dielectric (ILD) layer residues 30".

The foregoing particular configuration for each of the individual isolation regions is desirable insofar as a recess of an isolation region 12' with respect to a semiconductor material layer 26 is backfilled to a level nominally planar with the semiconductor material layer 26. Such a nominally planar backfill arrangement inherently also provides for sloped sidewall coverage of the semiconductor material layers 26, thus eliminating possible leakage pathways to lower levels of the semiconductor substrate 10'.

Figure 10:
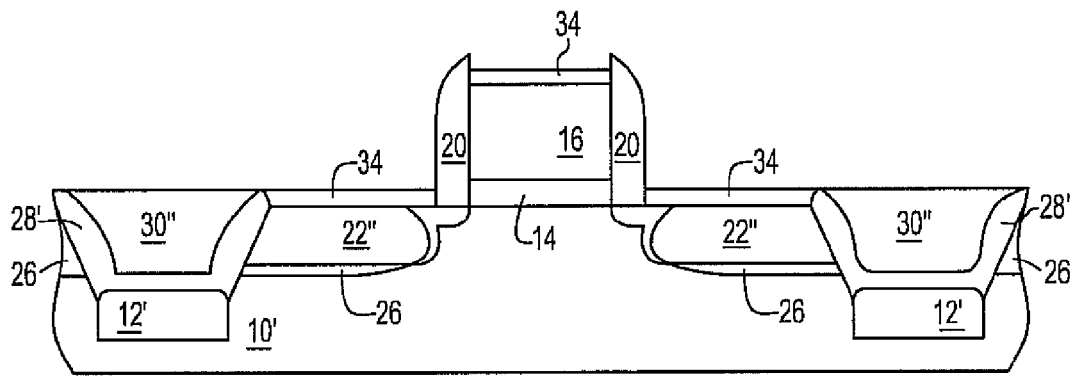

FIG. 10 shows a plurality of source/drain regions 22" located at least in part within the plurality of semiconductor material layers 26. The plurality of source/drain regions 22" is implanted so as to incorporate the plurality of extension regions 22. The plurality of source/drain regions 22" is implanted while using the gate electrode 16 and the first spacers 20 as a mask. Typically, the polarity of the source/drain regions 22" and the polarity of extension regions 22 are identical, although the chemical compositions of individual dopant species used for forming the extension regions 22 and the source/drain regions 22" may not necessarily be identical. Typically, the plurality of source/drain regions 22" is implanted to provide a dopant concentration from about 1e15 to about 1e23 dopant atoms per cubic centimeter within the larger contact region portions of the source/drain regions 22".

FIG. 10 also shows a plurality of silicide layers 34 located upon exposed silicon containing surfaces including the source/drain regions 22" and the gate electrode 16. The silicide layers 34 may comprise any of several silicide forming metals. Non-limiting examples of candidate silicide forming metals include nickel, cobalt, titanium, tungsten, erbium, ytterbium, platinum and vanadium silicide forming metals. Nickel and cobalt silicide forming metals are particularly common. Others of the above enumerated silicide forming metals are less common. Typically, the silicide layers 34 are formed using a salicide method. The salicide method includes: (1) forming a blanket silicide forming metal layer upon the semiconductor structure of FIG. 9; (2) thermally annealing the blanket silicide forming metal layer with silicon surfaces which it contacts to selectively form the silicide layers 34 while leaving unreacted metal silicide forming metal layers on, for example, the first spacers 20 and the isolation regions; and (3) selectively stripping unreacted portions of the silicide forming metal layers from, for example, the first spacers 20 and the isolation regions. Typically, the silicide layers 34 comprise a nickel silicide material or a cobalt silicide material that has a thickness from about 10 to about 1000 angstroms.

FIG. 10 shows a semiconductor structure in accordance with a preferred embodiment of the invention. The semiconductor structure includes a plurality of isolation regions each of which comprises: (1) an etched isolation region 12' as a lower lying dielectric plug layer; (2) a U shaped dielectric liner layer 28' located upon the etched isolation region 12'; and (3) an inter-level dielectric (ILD) layer residue 30" located upon the U shaped dielectric liner layer 28' and filling an aperture within the U shaped dielectric liner layer 28'. The foregoing isolation regions (and in particular the U shaped dielectric liner layer 28' included therein) cover a sidewall of a semiconductor material layer 26 that in turn incorporates a source/drain region 22" within a field effect transistor. By covering the sidewall of the semiconductor material layer 26 a leakage pathway to lower levels of a semiconductor substrate 10' over which is located the semiconductor material layer 26 is eliminated.

Further within the context of FIG. 10, the etched isolation regions 12' contact at least in part a first semiconductor material (i.e., typically a silicon semiconductor material) from which is comprised the semiconductor substrate 10', while the U shaped dielectric liner layers 28' contact at least in part a second semiconductor material (i.e., typically a silicon-germanium alloy semiconductor material or a silicon-carbon alloy semiconductor material) different from the first semiconductor material, and from which is comprised the semiconductor material layers 26.

The foregoing embodiment illustrates the invention within the context of backfilling a recess between an etched isolation region 12' within a semiconductor substrate 10' and a semiconductor material layer 26 located over the semiconductor substrate 10'. The etched isolation region 12' and the semiconductor substrate 10' result from etching an isolation region 12 within a semiconductor substrate 10. However, neither the instant embodiment nor the invention is intended to be so limited to backfilling a recess between an etched isolation region 12' and a semiconductor material layer 26 in accordance with the instant embodiment. Rather, the embodiments and the invention more broadly contemplate backfilling a recess between any type of isolation region and a surrounding semiconductor material layer or semiconductor substrate. As a particular alternative embodiment and example, the phantom lines within FIG. 2 illustrate a raised source/drain region 22''' that may be interposed between the gate electrode 16 and the isolation region 12 that is thus not otherwise recessed by etching. As is also illustrated by the phantom structures that are illustrated in FIG. 2, a recess aperture above the isolation region 12 that is not etched is filled with a U shaped dielectric liner layer 28", and further by a inter-level dielectric layer residue 30'''.

The preferred embodiments of the invention are illustrative of the invention rather than limiting of the invention. Revisions and modifications may be made to methods, materials, structures and dimensions of a semiconductor structure in accordance with the preferred embodiments of the invention, while still fabricating a semiconductor structure in accordance with the invention, further in accordance with the accompanying claims.

What is claimed is:

1. A semiconductor structure comprising:
    a semiconductor substrate including a first semiconductor material having a pedestal shaped channel region and a second semiconductor material at least laterally adjoining said pedestal shaped channel region, wherein said second semiconductor material is a different semiconductor material than the first semiconductor material so as introduce a stress into the pedestal shaped channel region; and
    an isolation region located within the semiconductor substrate, the isolation region comprising:
        a lower lying dielectric plug layer;
        a U shaped dielectric liner layer located upon the lower lying dielectric plug layer; and
        an upper lying dielectric plug layer filling an aperture within the U shaped dielectric liner layer, wherein the lower lying dielectric plug layer adjoins at least in part the first semiconductor material, and the U shaped dielectric liner layer adjoins at least in part the second semiconductor material different from the first semiconductor material.

2. The semiconductor structure of claim 1 wherein the isolation region is located within an isolation trench.

3. The semiconductor structure of claim 1 wherein lower lying dielectric plug layer has a maximum linewidth greater than a minimum linewidth of the upper lying dielectric plug layer.

4. The semiconductor structure of claim 1 wherein the lower lying dielectric plug layer and the upper lying dielectric plug layer comprise the same dielectric material.

5. The semiconductor structure of claim 1 wherein the upper lying dielectric plug layer and the U shaped dielectric liner layer comprise different dielectric materials.

6. The semiconductor structure of claim 1 wherein:
    each of the lower lying dielectric plug layer and the upper lying dielectric plug layer comprises a silicon oxide material; and
    the U shaped dielectric liner layer comprises a silicon nitride material.

7. The semiconductor structure of claim 1 wherein:
    the lower lying dielectric plug layer has a thickness from about 50 to about 5e4 angstroms;
    the U shaped dielectric liner layer has a thickness from about 10 to about 1e3 angstroms; and
    the upper lying dielectric plug layer has a thickness from about 50 to about 5e4 angstroms.

8. The semiconductor structure of claim 1 further comprising a silicide layer located upon the second semiconductor material.

9. The semiconductor structure of claim 1 wherein a gate electrode is located atop the pedestal shaped channel region.

10. The semiconductor structure of claim 9 further comprising a gate dielectric located between the gate electrode and the pedestal shaped channel region.

11. The semiconductor structure of claim 1 wherein said first semiconductor material is silicon, and the second semiconductor material is a silicon-germanium alloy.

12. The semiconductor structure of claim 1 wherein said first semiconductor material is silicon, and the second semiconductor material is a silicon-carbon alloy.

13. The semiconductor structure of claim 1 wherein said second semiconductor material is located within a recess formed in the first semiconductor material.

14. The semiconductor structure of claim 1 wherein said second semiconductor material is an epitaxial semiconductor material.

15. The semiconductor structure of claim 1 wherein said lower lying dielectric plug is not in direct contact with said second semiconductor material.

* * * * *